(12) United States Patent
Shiozaki et al.

(10) Patent No.: US 10,117,327 B2
(45) Date of Patent: Oct. 30, 2018

(54) RADIO-FREQUENCY MODULE

(71) Applicant: Panasonic Intellectual Property Management Co., Ltd., Osaka (JP)

(72) Inventors: Ryosuke Shiozaki, Tokyo (JP); Maki Nakamura, Osaka (JP); Junji Sato, Tokyo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 124 days.

(21) Appl. No.: 15/017,538

(22) Filed: Feb. 5, 2016

(65) Prior Publication Data

US 2016/0249448 A1    Aug. 25, 2016

(30) Foreign Application Priority Data

Feb. 23, 2015   (JP) ................................ 2015-032913

(51) Int. Cl.
*H05K 1/02*     (2006.01)
*H01L 23/66*    (2006.01)
(Continued)

(52) U.S. Cl.
CPC ..... *H05K 1/0243* (2013.01); *H01L 23/49822* (2013.01); *H01L 23/49827* (2013.01); *H01L 23/66* (2013.01); *H01L 24/00* (2013.01); *H05K 1/0298* (2013.01); *H05K 1/144* (2013.01); *H05K 1/181* (2013.01); *H01L 23/49811* (2013.01);
(Continued)

(58) Field of Classification Search
CPC .. H05K 1/0222; H05K 1/0237; H05K 1/0251; H01L 23/66; H01L 23/49827

USPC ...... 361/760–784; 174/259–264; 333/33–34, 333/260, 238
See application file for complete search history.

(56) References Cited

U.S. PATENT DOCUMENTS 7,394,337 B2 *   7/2008   Arai ........................ H01P 1/047
                                                           333/260
7,897,880 B1 *   3/2011   Goergen .............. H05K 1/0237
                                                           174/261

(Continued)

FOREIGN PATENT DOCUMENTS

JP    2001-308547       11/2001
WO    2013/084479 A1    6/2013

OTHER PUBLICATIONS

Extended European Search Report, dated Aug. 3, 2016, for corresponding EP Application No. 16154589.2-1552 / 3062342, 7 pages.

*Primary Examiner* — Tuan T Dinh
(74) *Attorney, Agent, or Firm* — Seed IP Law Group LLP

(57) ABSTRACT

A radio-frequency module includes: boards; interconnect parts that are conductor layers on the individual boards, at least one of the conductor layers being connected to an RF chip; a land that is a conductor layer connected to one of the interconnect parts; a transmission unit disposed between the boards, connected to the boards through the land to transmit a signal; a ground conductor disposed around the land and the interconnect part connected to the land; an isolation part disposed between the interconnect layer connected to the land and the ground conductor to isolate the interconnect layer connected to the land from the ground conductor; and a coupling part disposed between the land and the ground conductor to short-circuit the land and the ground conductor.

6 Claims, 14 Drawing Sheets

(51) Int. Cl.
*H05K 1/18* (2006.01)
*H05K 1/14* (2006.01)
*H01L 23/00* (2006.01)
*H01L 23/498* (2006.01)

(52) U.S. Cl.
CPC ............. *H01L 2223/6627* (2013.01); *H01L 2924/15311* (2013.01); *H05K 2201/042* (2013.01); *H05K 2201/10098* (2013.01); *H05K 2201/10378* (2013.01)

(56) References Cited

U.S. PATENT DOCUMENTS

| | | | |
|---|---|---|---|
| 8,729,405 B2* | 5/2014 | Ishida | H05K 1/0251 174/261 |
| 9,013,891 B2* | 4/2015 | Song | H01P 1/047 361/748 |
| 2001/0054939 A1 | 12/2001 | Zhu et al. | |
| 2005/0190614 A1* | 9/2005 | Brunette | H05K 1/0222 365/192 |
| 2007/0144773 A1* | 6/2007 | Saitou | H05K 1/0222 174/262 |
| 2008/0093112 A1* | 4/2008 | Kushta | H01P 1/2039 174/260 |
| 2008/0121421 A1* | 5/2008 | Kashiwakura | H05K 1/0251 174/262 |
| 2009/0133913 A1* | 5/2009 | Kushta | H01L 23/49827 174/260 |
| 2014/0145316 A1 | 5/2014 | Fujita et al. | |
| 2015/0222003 A1* | 8/2015 | Fujita | H01L 23/66 333/238 |

\* cited by examiner

RADIO-FREQUENCY MODULE

BACKGROUND

1. Technical Field

The present disclosure relates to a radio-frequency module connected to a radio frequency (RF) chip for a millimeter wave band and configured to transfer a radio-frequency signal.

2. Description of the Related Art

As a known radio-frequency module for transmitting a signal in a radio-frequency band such as a millimeter wave band, a module using, for example, a ball grid array (BGA) package has been used. To suppress degradation of pass characteristics of signals, a module for transmitting radio-frequency signals needs to match impedance.

For example, Japanese Unexamined Patent Application Publication No. 2001-308547 discloses a configuration in which a matching circuit whose line width and line length is adjusted to obtain matching between a via connecting a plurality of circuit layers and a signal line connected to the via is provided in part of the signal line.

SUMMARY

In the known technique of Japanese Unexamined Patent Application Publication No. 2001-308547, however, since the matching circuit needs to be provided in part of the signal line, an increase in the circuit scale needs to be handled.

One non-limiting and exemplary embodiment provides a radio-frequency module that can obtain impedance matching with a simple configuration without an increase in circuit scale.

In one general aspect, the techniques disclosed here feature a radio-frequency module including: a plurality of boards; a plurality of interconnect parts that are a plurality of conductor layers, each conductor layer of the plurality of conductor layers being provided on a corresponding one of the plurality of boards, at least one of the plurality of conductor layers being connected to an RF chip; a land that is a conductor layer connected to an interconnect part of the plurality of interconnect parts; a transmission circuitry disposed between two of the plurality of boards, and connected to the plurality of boards through the land to transmit a signal; a ground conductor disposed around the land and the interconnect part to which the land is connected; an isolation part disposed between the land and the ground conductor to isolate the land and the ground conductor from each other, and disposed between the interconnect part to which the land is connected and the ground conductor to isolate the interconnect part to which the land is connected and the ground conductor from each other; and a coupling part disposed between the land and the ground conductor to short-circuit the land and the ground conductor.

These general and specific aspects may be implemented using a device, a system, and any combination of devices and systems.

According to the present disclosure, impedance matching can be obtained with a simple configuration without an increase in circuit scale.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

First, a typical configuration of a radio-frequency module using a ball grid array (BGA) package in the present disclosure and possible problems thereof will be described with reference to the drawings.

Figure 1:
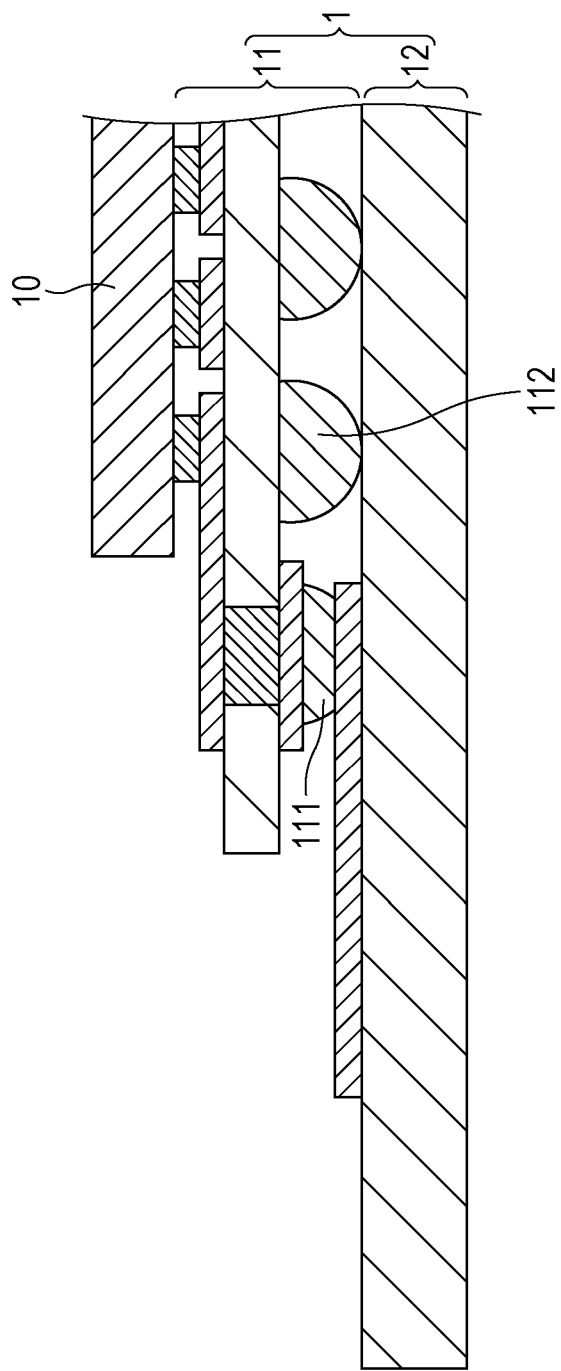
FIG. 1 is a cross sectional view schematically illustrating a typical configuration of a radio-frequency module 1 using a BGA package.

FIG. 1 is a cross sectional view schematically illustrating a typical configuration of a radio-frequency module 1 using a BGA package. The radio-frequency module 1 illustrated in FIG. 1 includes a BGA package 11 and a printed circuit board 12, and is connected to an RF chip 10 for a millimeter wave band.

A surface of the BGA package 11 at one side is connected to the RF chip 10. Another surface of the BGA package 11 at the other side is provided with a signal transmission ball 111 and a grounding ball 112, and is connected to the printed circuit board 12 through the signal transmission ball 111. The signal transmission ball 111 is a transmission unit for allowing a signal to be transmitted between the BGA package 11 and the printed circuit board 12. The grounding ball 112 is disposed adjacent to the signal transmission ball 111, and has a zero potential.

Figure 2:
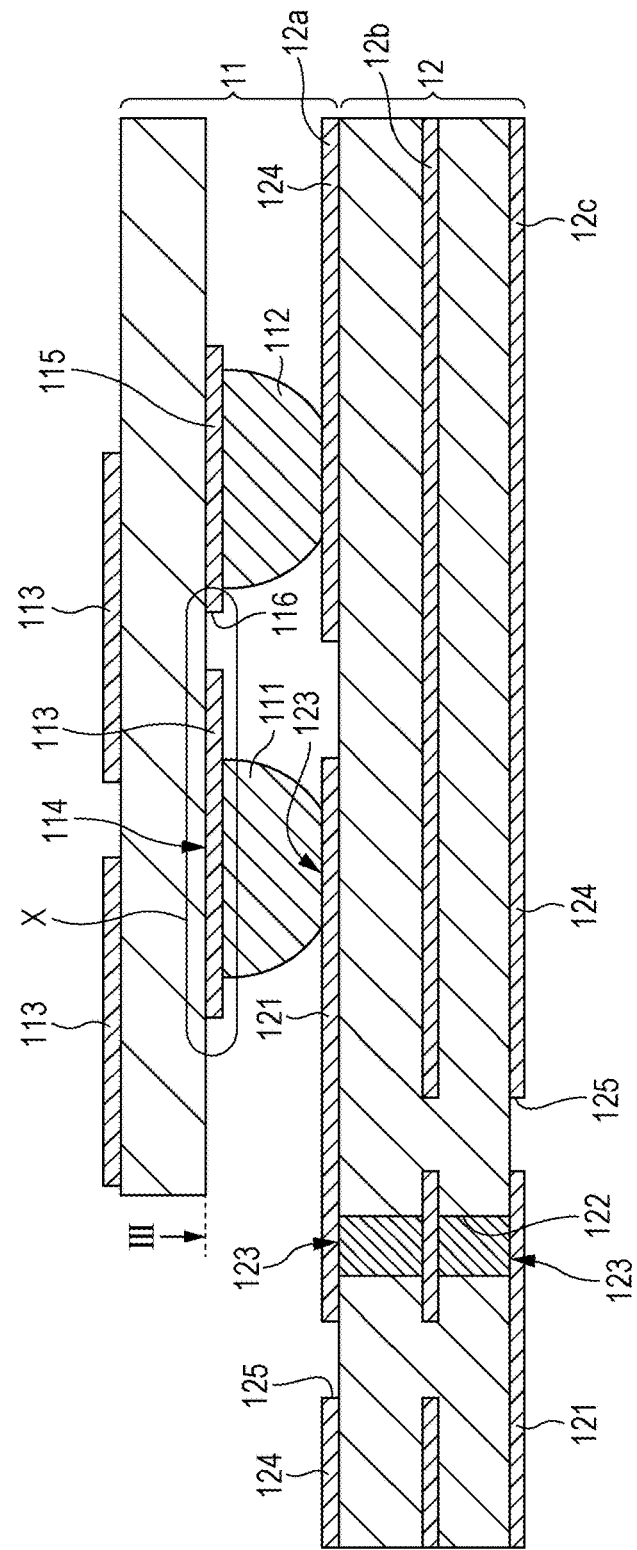
FIG. 2 is a cross sectional view schematically illustrating an example configuration of the typical radio-frequency module.

The configuration of the radio-frequency module 1 will now be more specifically described. FIG. 2 is a cross sectional view schematically illustrating the configuration of the typical radio-frequency module 1.

As illustrated in FIG. 2, a plurality of interconnect parts 113 are formed on either surface of the BGA package 11 and used for signal transmission. A land 114 is provided on a surface of the BGA package 11 not connected to the RF chip 2 (see FIG. 1) and is connected to the interconnect parts 113. The interconnect parts 113 and the land 114 are conductor layers provided on the surfaces.

A ground conductor 115 is a conductor layer disposed around the interconnect parts 113 and the land 114, and is connected to the grounding ball 112 to have a zero potential. An isolation part 116 is a notch formed on a plane and isolates the land 114 and the ground conductor 115 from each other.

Each of the signal transmission ball 111 and the grounding ball 112 is disposed in a location where the land 114 is formed. Each of the signal transmission ball 111 and the grounding ball 112 is formed by soldering, and has a substantially spherical shape due to surface tension. Locations of the signal transmission ball 111, the interconnect parts 113, and the land 114 will be described later.

The printed circuit board 12 includes interconnect parts 121, vias 122, lands 123, ground conductors 124, and isolation parts 125, and is constituted by a plurality of layers. The interconnect parts 121 are constituted by a plurality of layers, and serves as interconnections among circuits provided in a front layer 12a, an inner layer 12b, and a back layer 12c of the printed circuit board 12. Each of the vias 122 is a transmission unit for transmitting a signal among the layers of the printed circuit board 12.

The land 123 is provided in a portion where the signal transmission ball 111 is connected to the front layer 12a of the printed circuit board 12. The land 123 is a conductor layer similar to the interconnect parts 121, and is connected to the interconnect part 121.

The land 123 is disposed between the via 122 and the corresponding interconnect parts 121. The via 122 is connected to the interconnect part 121 through the land 123.

The ground conductors 124 are conductor layers disposed around the interconnect parts 121 and the land 123, and have a zero potential. Each of the isolation parts 125 is a notch formed on a plane between a set of the interconnect part 121 and the land 123, and the ground conductor 124, and isolates the set of the interconnect part 121 and the land 123 from the ground conductor 124.

Figure 3:
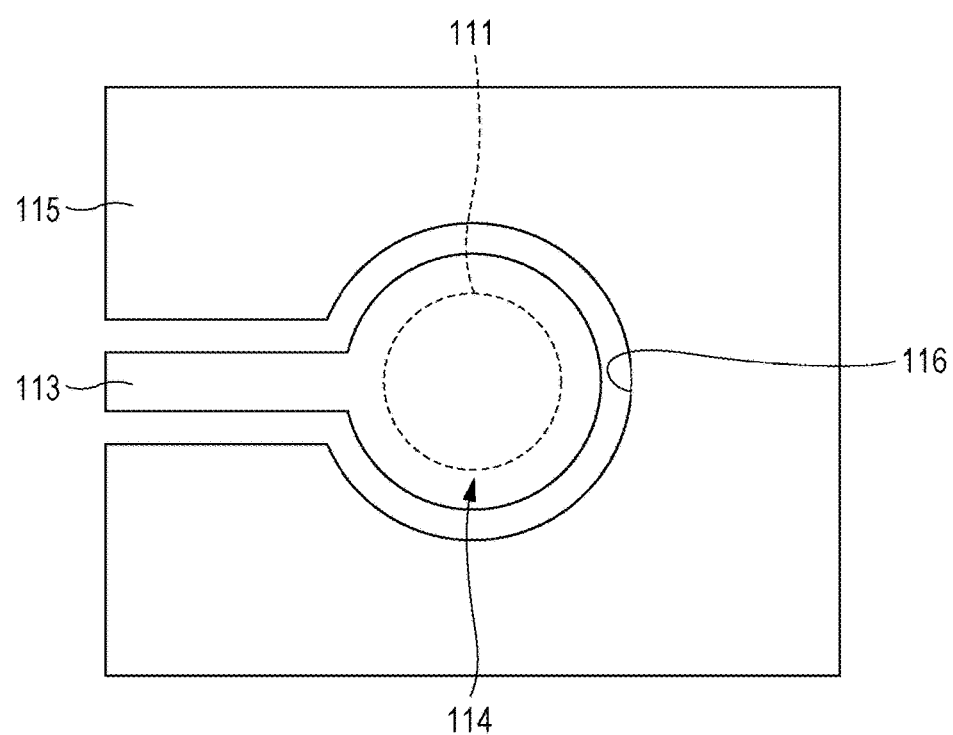
FIG. 3 is an enlarged view illustrating a configuration of a main portion of the typical radio-frequency module.

Configurations of the signal transmission ball 111, the interconnect part 113, and the land 114 will be described. FIG. 3 is an enlarged view illustrating a configuration of a main portion of the typical radio-frequency module 1. FIG. 3 is an enlarged view of a region indicated by arrow X in FIG. 2 and viewed in a direction of arrow III in FIG. 2.

In FIG. 3, the signal transmission ball 111 is connected to the interconnect part 113 through the land 114. The ground conductor 115 is a conductor layer provided around the interconnect part 113 and the land 114, and has a zero potential when connected to the grounding ball 112 (see FIG. 2). The isolation part 116 is a notch formed in a plane between a set of the interconnect part 113 and the land 114, and the ground conductor 115, and isolates the set of the interconnect part 113 and the land 114 from the ground conductor 115.

In the radio-frequency module 1 using the typical BGA package as illustrated in FIGS. 1 and 2, the ground conductor 115 having a zero potential is generally formed outside the interconnect part 113 and the land 114.

In the case of the configuration constituted by the signal transmission ball 111, the interconnect part 113, and the land 114 illustrated in FIG. 3, an impedance is discontinuous due to the capacitance of the land 114, and thus, it is difficult to obtain impedance matching. The impedance matching will now be described.

Figure 4:
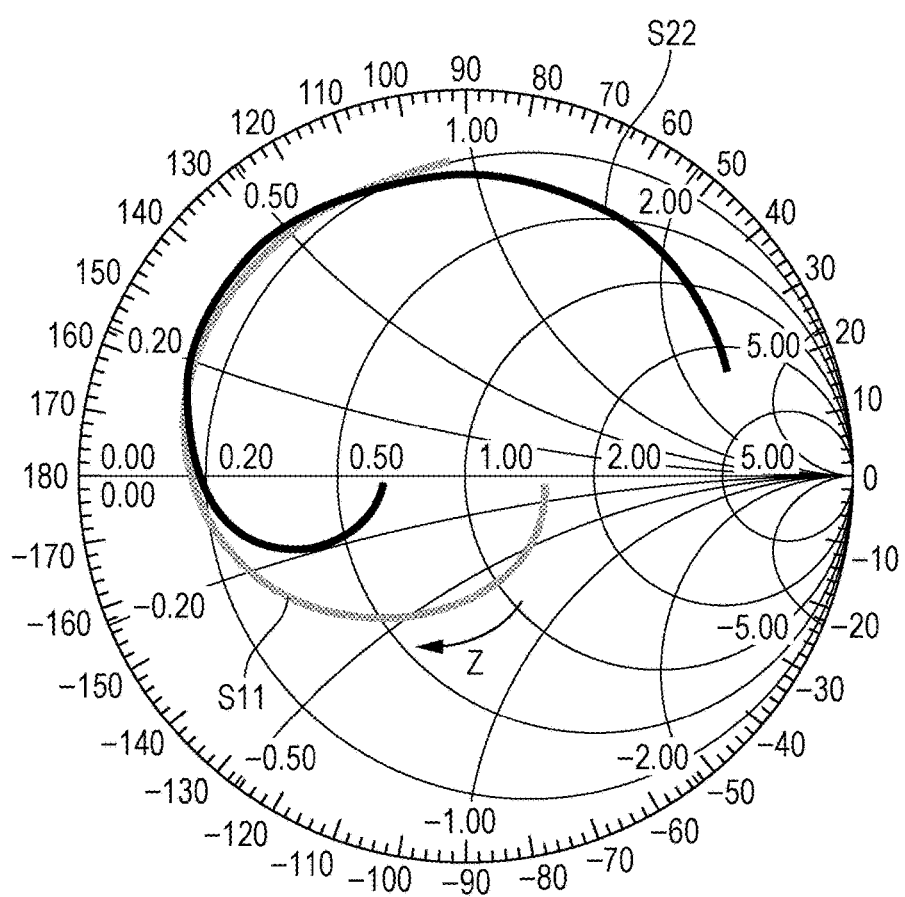
FIG. 4 is a Smith chart showing reflectance characteristics of a signal in a land of the typical radio-frequency module.

FIG. 4 is a Smith chart showing reflectance characteristics of a signal in the land 114 of the typical radio-frequency module 1. FIG. 4 shows paths of changes from 0 Hz to 100 GHz in S-parameters S11 and S22 in the land 114.

Under the influence of capacitance of the land 114, the paths of the S-parameters S11 and S22 move in a direction indicated by arrow Z, i.e., downward in a clockwise direction. The paths of the S-parameters S11 and S22 move away from the center of the Smith chart as the frequency increases. That is, as the frequency increases, discontinuity of impedance increases. Next, pass characteristics and reflectance characteristics of a signal in the land 114 will be specifically described.

Figure 5:
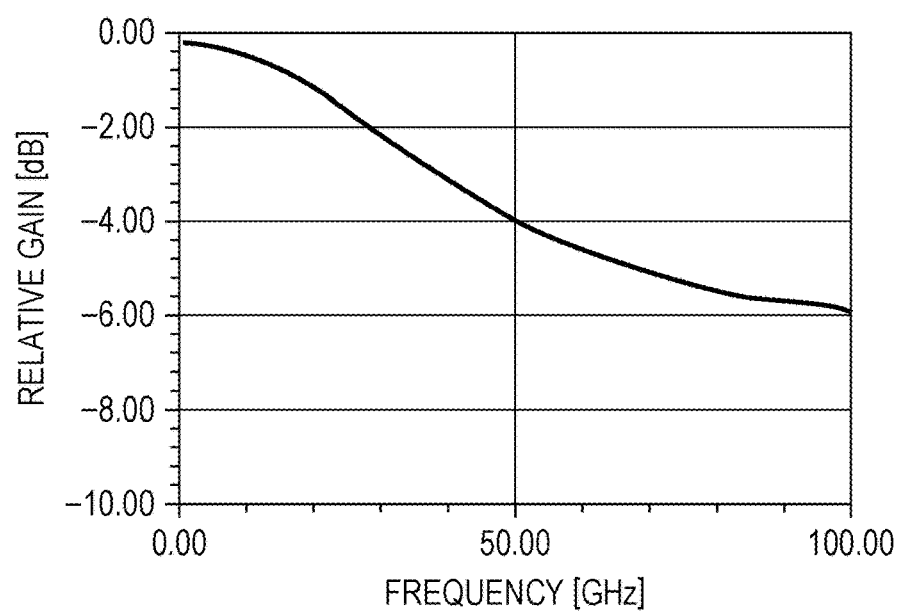
FIG. 5 shows pass characteristics of a signal in the land of the typical radio-frequency module.
Figure 6:
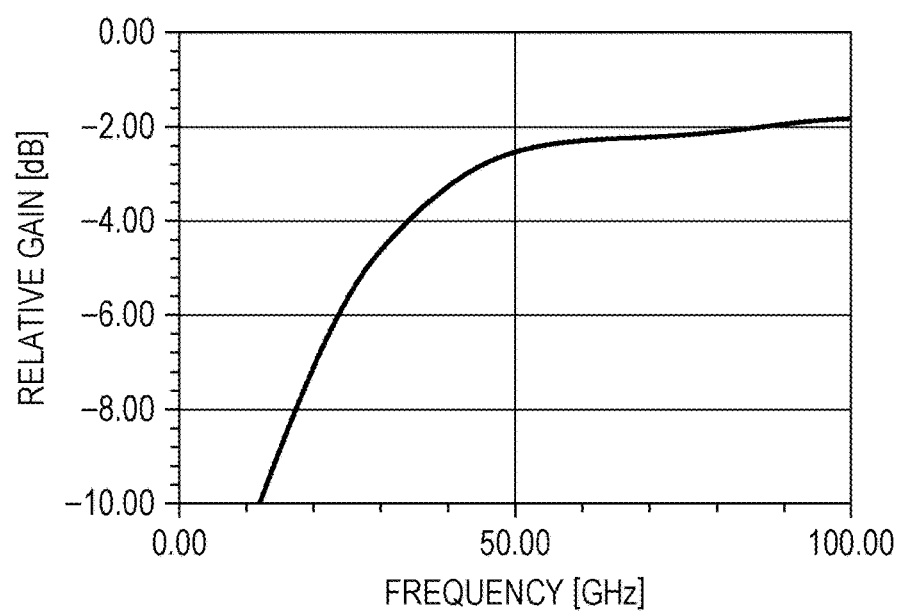
FIG. 6 shows reflectance characteristics of a signal in the land of the typical radio-frequency module.

FIG. 5 shows pass characteristics of a signal in the land 114 of the typical radio-frequency module 1. FIG. 6 shows reflectance characteristics of a signal in the land 114 of the typical radio-frequency module 1.

In FIG. 5, the abscissa represents the frequency of a signal, and the ordinate represents a relative gain indicating the intensity of a signal passing through the land 114. In FIG. 5, as the value on the ordinate increases, pass characteristics of the signal improve. In FIG. 6, the abscissa represents the frequency of a signal, and the ordinate represents a relative gain indicating the intensity of a signal reflected on the land 114. In FIG. 5, as the value on the ordinate increases, the degree of reflection of the signal increases.

In the configuration of FIG. 3, the intensity of a signal passing through the land 114 is small in a millimeter wave band (a frequency band of 30 GHz or more), as shown in FIG. 5. As shown in FIG. 6, a signal in a millimeter wave band greatly reflects on the land 114. That is, as shown in FIGS. 5 and 6, under the influence of discontinuity of impedance due to the capacitance of the land 114, pass characteristics of a signal in a millimeter wave band degrades.

For example, in Japanese Unexamined Patent Application Publication No. 2001-308547, matching circuits having different line widths and line lengths are provided between an interconnect part and a land to reduce discontinuity of impedance due to the capacitance of the land. However, the matching circuits of Japanese Unexamined Patent Application Publication No. 2001-308547 shows a variation in impedance depending on the accuracy of the line width and line length, and thus, it is difficult to reduce impedance discontinuity sufficiently.

The present disclosure focused on the configuration of a land.

Embodiment

An embodiment of the present disclosure will be described in detail with reference to the drawings. The following embodiment is merely an example, and is not intended to limit the present disclosure.

A configuration of a radio-frequency module according to an embodiment of the present disclosure will be described with reference to FIG. 7.

Figure 7:
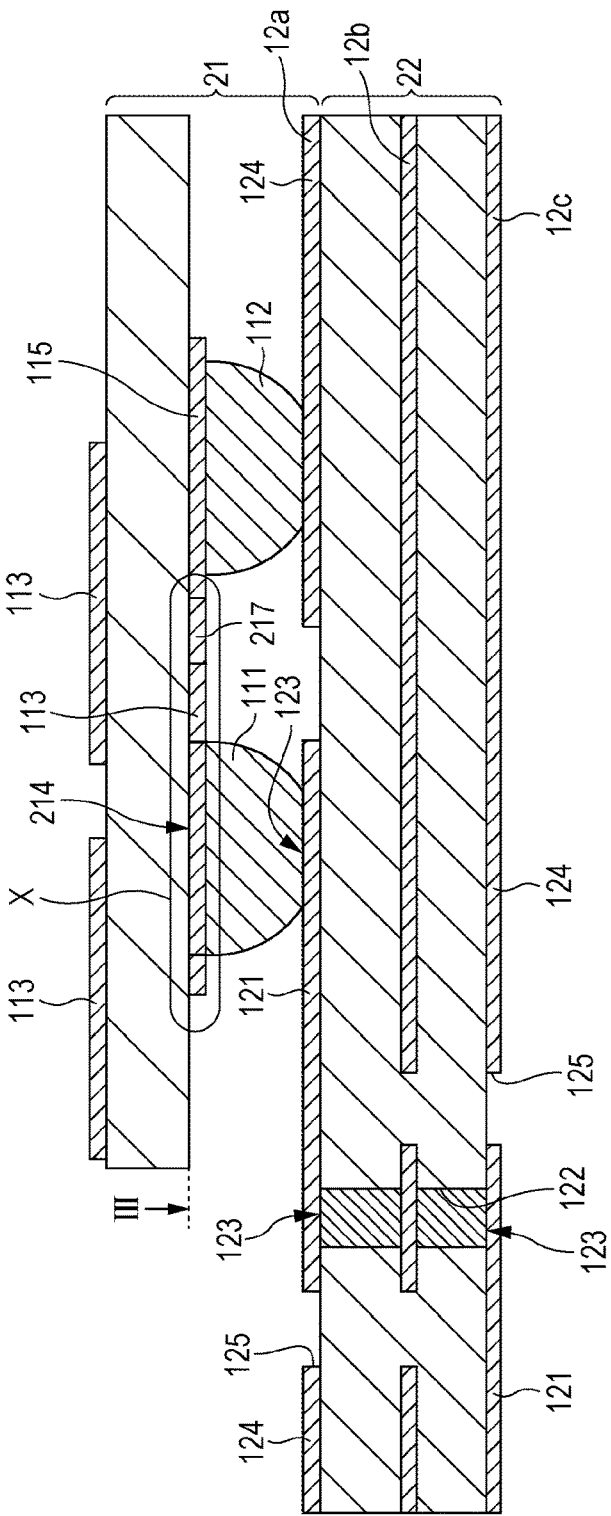
FIG. 7 is a cross-sectional view schematically illustrating an example configuration of a radio-frequency module according to an embodiment of the present disclosure.

FIG. 7 is a cross-sectional view schematically illustrating an example configuration of a radio-frequency module 2 according to an embodiment of the present disclosure. The radio-frequency module 2 illustrated in FIG. 7 includes a BGA package 21 and a printed circuit board 22. In FIG. 7, components of the configuration also shown in FIG. 2 are denoted by the same reference characters as those used in FIG. 2, and detailed description thereof is not repeated. The radio-frequency module 2 illustrated in FIG. 7 includes a land 214 different from the land 114 illustrated in FIG. 2, and a coupling part 217 is added to the configuration illustrated in FIG. 2. Although not shown in FIG. 7, the radio-frequency module 2 of this embodiment includes an isolation part 216 different from the isolation part 116 illustrated in FIGS. 2 and 3. The land 214, the isolation part 216, and the coupling part 217 will now be described with reference to FIG. 8.

Figure 8:
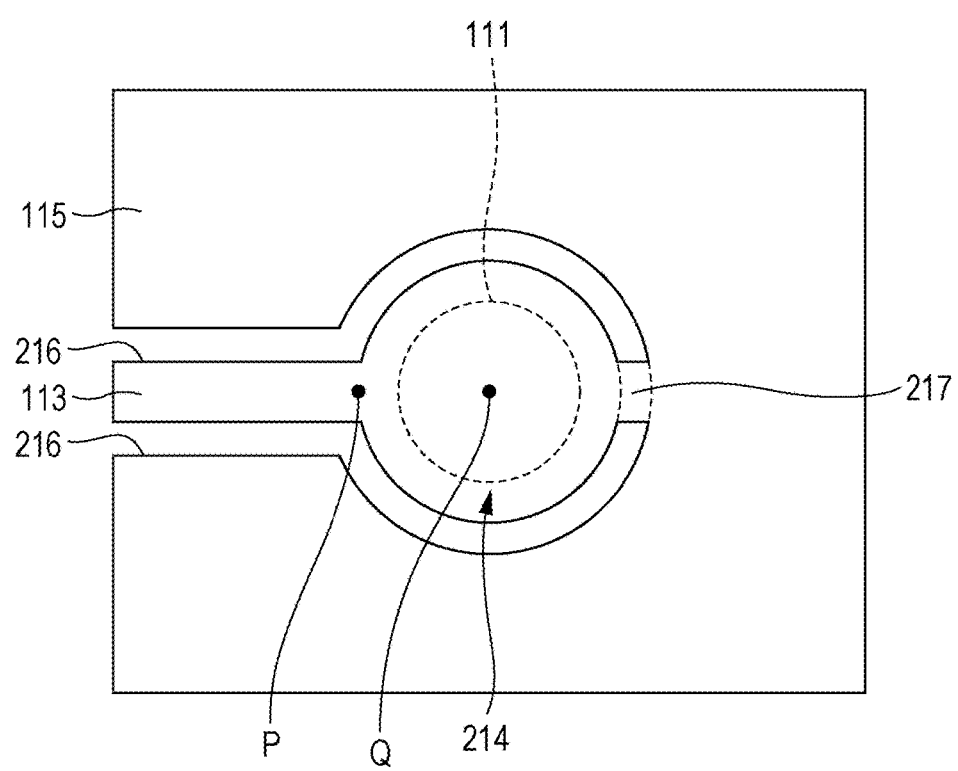
FIG. 8 is an enlarged view illustrating a configuration of a main portion of the radio-frequency module according to the embodiment of the present disclosure.

FIG. 8 is an enlarged view illustrating a configuration of a main portion of the radio-frequency module 2 according to the embodiment of the present disclosure. FIG. 8 is an enlarged view of a region indicated by arrow X in FIG. 7 and viewed in a direction of arrow III in FIG. 7.

In FIG. 8, the signal transmission ball 111 is a transmission unit for transmitting a signal between a BGA package 21 (see FIG. 7) and a printed circuit board 22 (see FIG. 7), and is connected to an interconnect part 113 through the land 214. A ground conductor 115 is a conductor layer provided around the interconnect part 113 and the land 214, and has a zero potential when connected to a grounding ball 112 (see FIG. 7). The isolation part 216 is a notch formed on a plane between a set of the interconnect part 113 and the land 214, and the ground conductor 115, and isolates the set of the interconnect part 113 and the land 214 from the ground conductor 115.

The land 214 is a circular conductor layer, and is connected to the interconnect part 113 at a point P.

In the land 214, the coupling part 217 is disposed at the side of a center Q opposite to the point P, i.e., on a line extending from a line connecting a center Q and the interconnect part 113. The coupling part 217 couples the land 214 and the ground conductor 115 to each other, and partially short-circuits the land 214.

The configuration illustrated in FIG. 8 can obtain impedance matching of the radio-frequency module 2 according to this embodiment. Characteristics of the radio-frequency module 2 of this embodiment will now be described.

Figure 9:
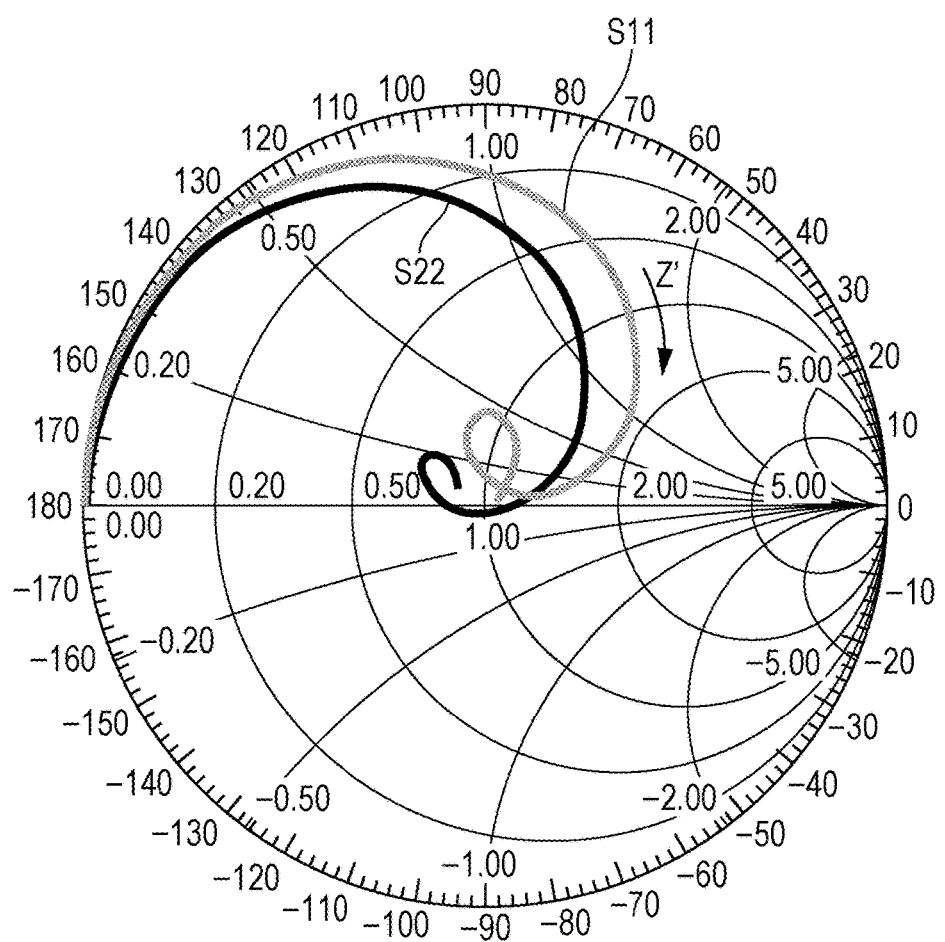
FIG. 9 is a Smith chart showing reflectance characteristics of a signal in a land of the radio-frequency module according to the embodiment of the present disclosure.

FIG. 9 is a Smith chart showing reflectance characteristics of a signal in the land 214 of the radio-frequency module 2 according to the embodiment of the present disclosure. In a manner similar to FIG. 4, FIG. 9 shows paths of changes from 0 Hz to 100 GHz in S-parameters S11 and S22 in the land 214.

Since the land 214 is partially short-circuited, the paths of the S-parameters S11 and S22 start from the left end of a horizontal line in the Smith chart. Under the influence of capacitance of the land 214, the S-parameters S11 and S22 moves in a direction indicated by arrow Z', i.e., downward in a clockwise direction. The paths of the S-parameters S11 and S22 approach the center of the Smith chart as the frequency increases. That is, as the frequency increases, impedance discontinuity is gradually canceled, and impedance matching can be obtained. Pass characteristics and reflectance characteristics of a signal in the land 214 will now be described in detail.

Figure 10:
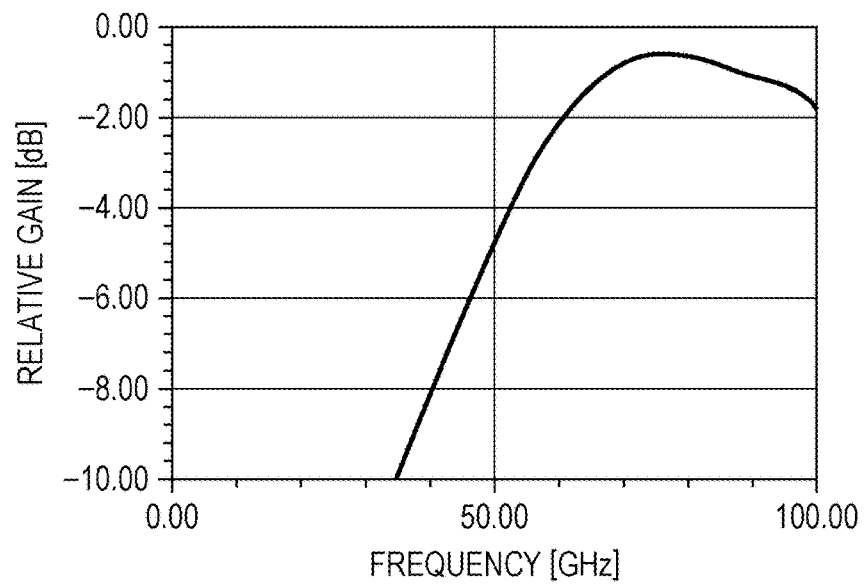
FIG. 10 shows pass characteristics of a signal in the land of the radio-frequency module according to the embodiment of the present disclosure.
Figure 11:
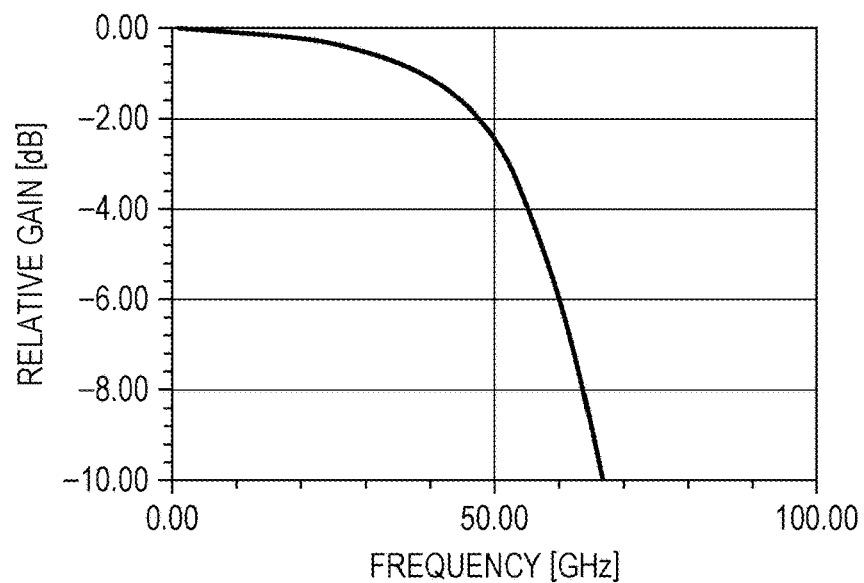
FIG. 11 shows reflectance characteristics of a signal in the land of the radio-frequency module according to the embodiment of the present disclosure.

FIG. 10 shows pass characteristics of a signal in the land 214 of the radio-frequency module 2 according to the embodiment of the present disclosure. FIG. 11 shows reflectance characteristics of a signal in the land 214 of the radio-frequency module 2 according to the embodiment of the present disclosure.

In FIG. 10, the abscissa represents the frequency of a signal, and the ordinate represents a relative gain indicating the intensity of a signal passing through the land 214. FIG. 10 shows that as the value on the ordinate increases, pass characteristics of the signal improves. In FIG. 11, the abscissa represents the frequency of a signal, and the ordinate represents a relative gain indicating the intensity of a signal reflected on the land 214. FIG. 11 shows that as the value on the ordinate increases, the degree of reflection of the signal increases.

In the configuration of FIG. 8, the intensity of a signal passing through the land 214 can be increased in a millimeter wave band, as shown in FIG. 10. As shown in FIG. 11, the intensity a signal reflected in the land 214 is reduced in a millimeter wave band.

That is, in the configuration of FIG. 8, the coupling part 217 couples the land 214 and the ground conductor 115 to each other and partially short-circuits the land 214 so that impedance matching can be obtained. As a result of impedance matching, as shown in FIGS. 10 and 11, reflection of a signal in a millimeter wave band can be reduced so that pass characteristics can be enhanced.

Signal transmission in the radio-frequency module 2 of this embodiment will be described in comparison with signal transmission in the typical radio-frequency module 1 illustrated in FIG. 2.

Figure 12:
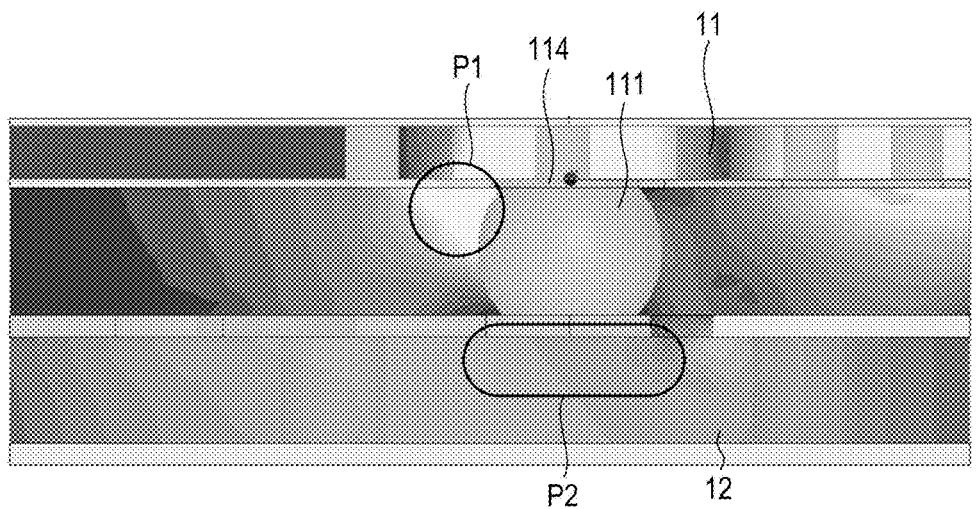
FIG. 12 illustrates signal transmission in the typical radio-frequency module.
Figure 13:
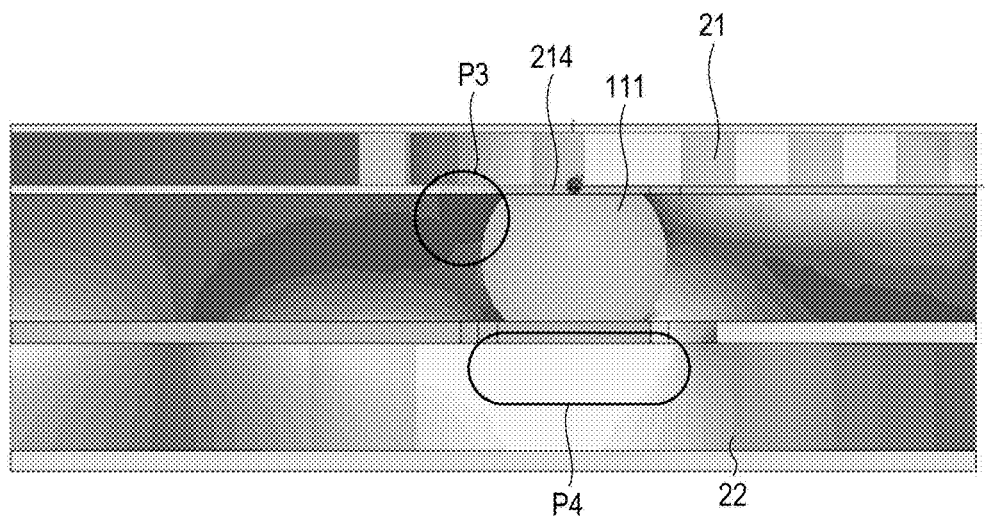
FIG. 13 illustrates signal transmission in the radio-frequency module according to the embodiment of the present disclosure.

FIG. 12 is a schematic illustration of signal transmission in the typical radio-frequency module 1. FIG. 13 is a schematic illustration of signal transmission in the radio-frequency module 2 according to this embodiment of the present disclosure. FIGS. 12 and 13 illustrate locations where signal intensity is high in the case of transmission of a signal in a millimeter wave band, by using light and dark patterns. In FIGS. 12 and 13, a lighter region indicates a location where the signal intensity is higher.

In the typical radio-frequency module 1, as illustrated in a region P1 in FIG. 12, a signal in a millimeter wave band is emitted from the land 114 connected to the signal transmission ball 111 to the outside of the board. Consequently, as illustrated in a region P2, the intensity of the signal transmitted to the printed circuit board 12 decreases.

On the other hand, in the radio-frequency module 2 of this embodiment, as illustrated in a region P3 in FIG. 13, a signal in a millimeter wave band is not emitted from the land 214 connected to the signal transmission ball 111 to the outside of the board. This is because the land 214 is connected to the ground conductor 115 through the coupling part 217 and is short-circuited so that the potential at the region P3 is zero. Since the signal is not emitted to the outside of the board, the intensity of a signal transmitted to the printed circuit board 22 can be increased, as illustrated in a region P4.

As described above, in this embodiment, the land 214 is partially short-circuited by connecting the land 214 to the ground conductor 115 through the coupling part 217. Thus, excellent pass characteristics of a signal can be achieved, and impedance matching can be obtained.

Other Configurations of Embodiment

In the embodiment described above, in the configuration illustrated in FIG. 8, i.e., in the land 214, the coupling part 217 is disposed at the side of the center Q opposite to the point P. Alternatively, the embodiment may employ a configuration except the configuration illustrated in FIG. 8. Another configuration except the configuration illustrated in FIG. 8 will now be described.

Variation 1

In Variation 1 of the embodiment, the location of the coupling part 217 provided in the land 214 is different from that in the configuration illustrated in FIG. 8.

Figure 14:
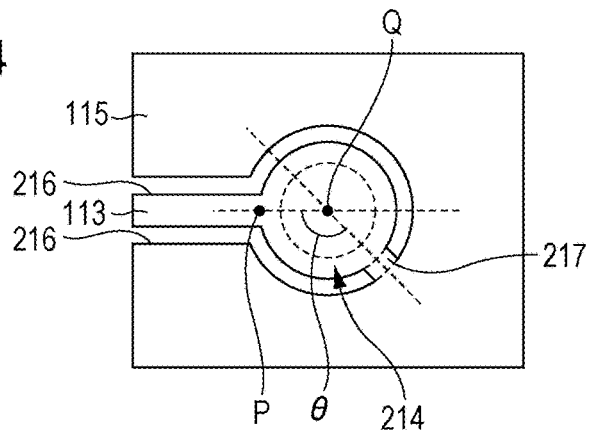
FIG. 14 is an enlarged view illustrating a configuration of a main portion of a radio-frequency module according to Variation 1 of the embodiment.

FIG. 14 is an enlarged view illustrating a configuration of a main portion of a radio-frequency module 2 according to Variation 1 of this embodiment. As illustrated in FIG. 14, the coupling part 217 is disposed to form an angle θ with respect to a straight line connecting the center Q and the point P.

Variation 2

In Variation 2 of the embodiment, the shape of the isolation part 216 provided outside the coupling part 217 is different from that in the configuration illustrated in FIG. 8.

Figure 15:
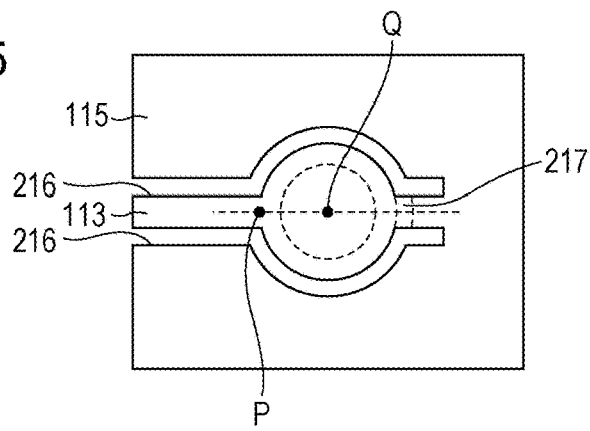
FIG. 15 is an enlarged view illustrating a configuration of a main portion of a radio-frequency module according to Variation 2 of the embodiment.

FIG. 15 is an enlarged view illustrating a configuration of a main portion of a radio-frequency module 2 according to Variation 2 of the embodiment. As illustrated in FIG. 15, the isolation part 216 is disposed outside the coupling part 217 and extends substantially in parallel with a straight line connecting the center Q and the point P in a direction away from the center Q.

Variation 3

In Variation 3 of this embodiment, the location of the coupling part 217 provided in the land 214 and the number of the coupling parts 217 are different from those in the configuration illustrated in FIG. 8.

Figure 16:
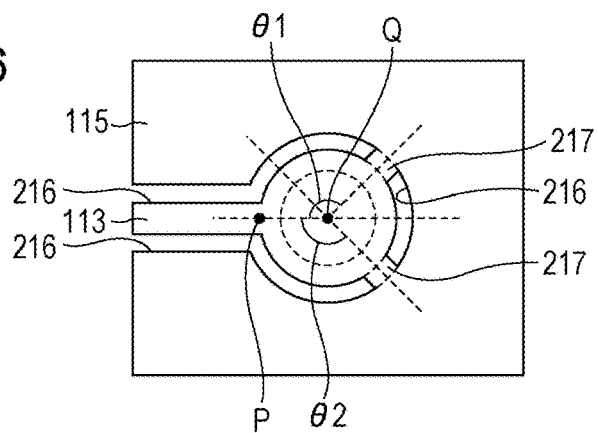
FIG. 16 is an enlarged view illustrating a configuration of a main portion of a radio-frequency module according to Variation 3 of the embodiment.

FIG. 16 is an enlarged view illustrating a configuration of a main portion of a radio-frequency module 2 according to Variation 3 of this embodiment. As illustrated in FIG. 16, the coupling parts 217 are disposed in directions that form angles θ1 and θ2 with respect to the straight line connecting the center Q and the point P.

Differences among the configurations illustrated in FIGS. 8, 14, and 15 will now be described.

As described above, in the typical radio-frequency module 1, the ground conductor 115 is disposed outside the interconnect part 113 and is isolated by the isolation part 116. In this configuration, a current flowing in a direction opposite to the direction of a radio-frequency current transmitted through the interconnect part 113 flows in the ground conductor 115.

Figure 17:
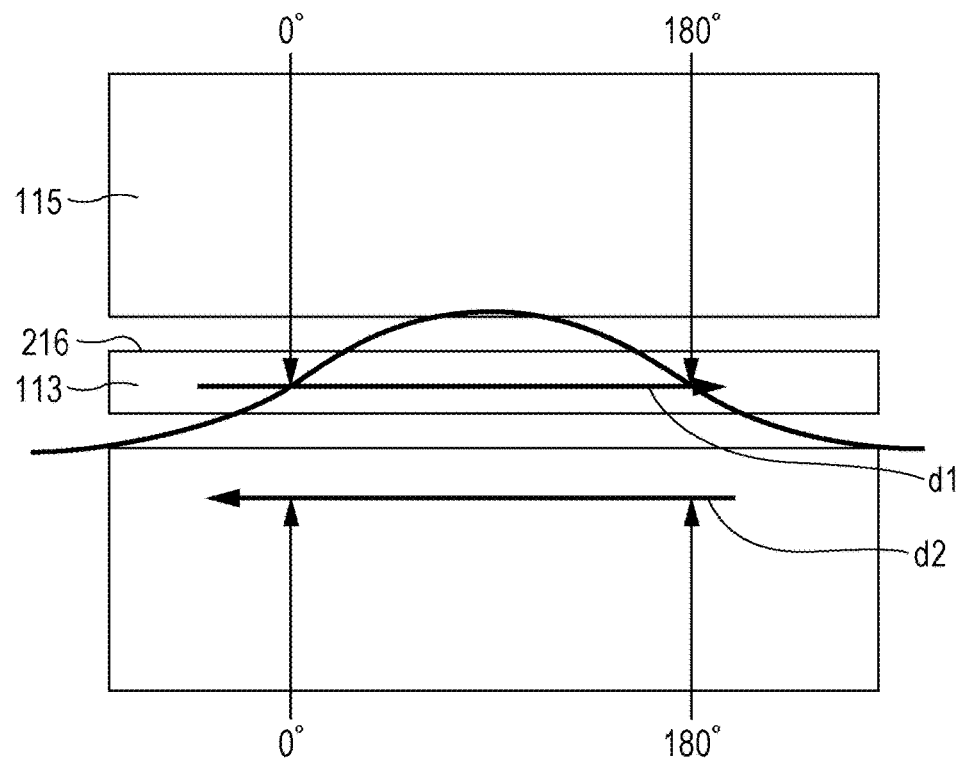
FIG. 17 illustrates states of a current transmitted through an interconnect part and a current flowing in a ground conductor.

FIG. 17 illustrates states of a current transmitted through the interconnect part 113 and a current flowing in the ground conductor 115. As illustrated in FIG. 17, a phase of a current d1 transmitted through the interconnect part 113 and a phase of a current d2 flowing in the ground conductor 115 are opposite to each other in a direction perpendicular to the direction of the current d1 and d2. The same holds for the radio-frequency module 2 of this embodiment.

On the other hand, in this embodiment, the land 214 includes the coupling part 217 connected to the ground conductor 115 so that a path of a current flowing in the ground conductor 115 is connected to the signal transmission ball 111 through the coupling part 217. In this case, the phase of the current flowing in the ground conductor 115 coincides with a phase of a current flowing from the interconnect part 113 into the land 214, in the signal transmission ball 111.

In the variations of this embodiment as illustrated in FIGS. 8, 14, and 15, the length of a path of a current flowing in the ground conductor 115 is adjusted in accordance with the frequency of a current so that impedance matching can be more effectively obtained.

Figure 18A:
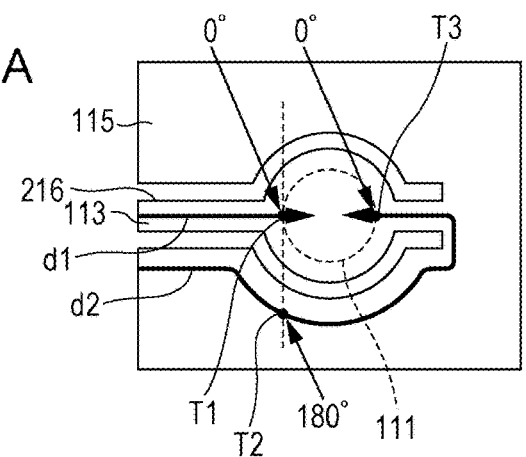
FIG. 18A illustrates a current path in the configuration of FIG. 15.
Figure 18B:
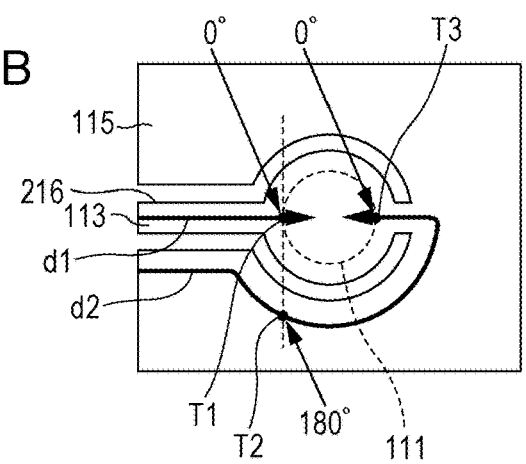
FIG. 18B illustrates a current path in the configuration of FIG. 8.
Figure 18C:
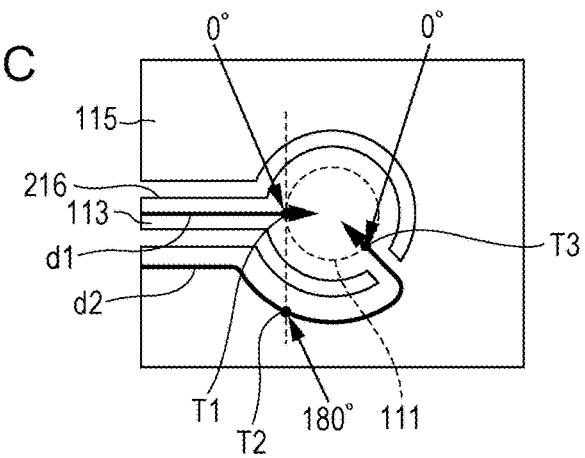
FIG. 18C illustrates a current path in the configuration of FIG. 14.

FIGS. 18A to 18C illustrate paths of current in the configurations of FIGS. 15, 8, 14, respectively.

As illustrated in FIG. 18A, a phase (0° in FIG. 18A) of a current d1 flowing in the interconnect part 113 at a point T1 where the current d1 reaches a signal transmission ball 111 is opposite to a phase (180° in FIG. 18A) of a current d2 flowing in the ground conductor 115 at a point T2 that is an intersection between a line passing through the point T1 and perpendicular to the current d1 and the current d2. On the other hand, the path of the current d2 is connected to the signal transmission ball 111 through the coupling part 217 at a point T3. In this configuration, the phase (0° in FIG. 18A) of the current d2 at the point T3 coincides with the phase of the current d1 at the point T1 in the signal transmission ball 111. The same holds for FIGS. 18B and 18C.

That is, in this embodiment, the path length from the point T2 to the point T3 of the current d2 is approximately ½ wavelength of a current flowing.

As illustrated in FIGS. 18A to 18C, a path length form the point T2 of the current d2 to the point T3 decreases in the order of FIGS. 18A, 18B, and 18C. That is, in a case where the frequency of a current is relatively low, the configuration of FIG. 15 corresponding to FIG. 18A may be employed. In a case where the frequency of a current is relatively high, the configuration of FIG. 14 corresponding to FIG. 18C may be employed. In this case, in the configuration of FIG. 14, the angle θ formed by the coupling part 217 with respect to the straight line connecting the center Q and the point P may be set based on the frequency of a current.

As described above, the shapes and locations of the land 214, the isolation part 216, and the coupling part 217 may be adjusted based on the frequency of a current. In this embodiment, impedance matching can be more effectively obtained by performing adjustment based on the frequency of a current.

In this embodiment, the shapes and locations of the land 214, the isolation part 216, and the coupling part 217 are not necessarily adjusted based on the frequency of a current. In this embodiment, the configuration in which the land 214 is partially short-circuited when connected to the ground conductor 115 through the coupling part 217 can maintain excellent pass characteristics of a signal and obtain impedance matching.

In the embodiment described above, as illustrated in FIG. 7, the coupling part 217 is provided in the land 214 connected to the signal transmission ball 111 in the BGA package 21. However, the present disclosure is not limited to this example.

Figure 19A:
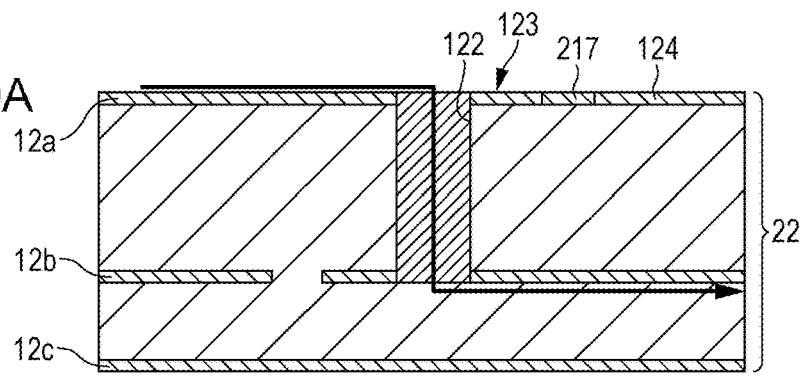
FIG. 19A illustrates an example of the location of a coupling part in the embodiment of the present disclosure.
Figure 19B:
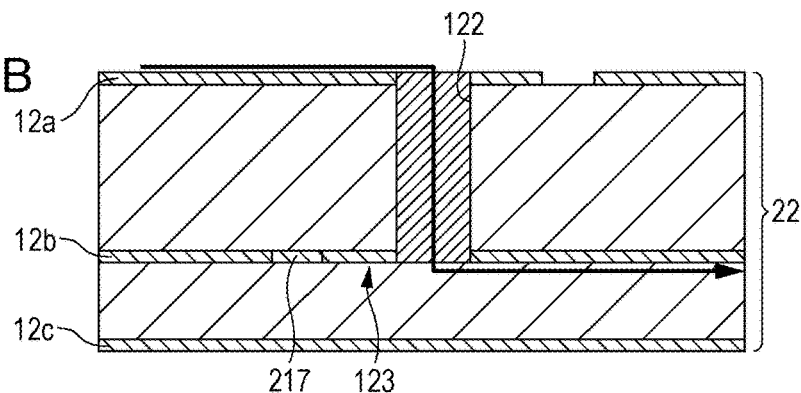
FIG. 19B illustrates an example of the location of the coupling part in the embodiment of the present disclosure.
Figure 19C:
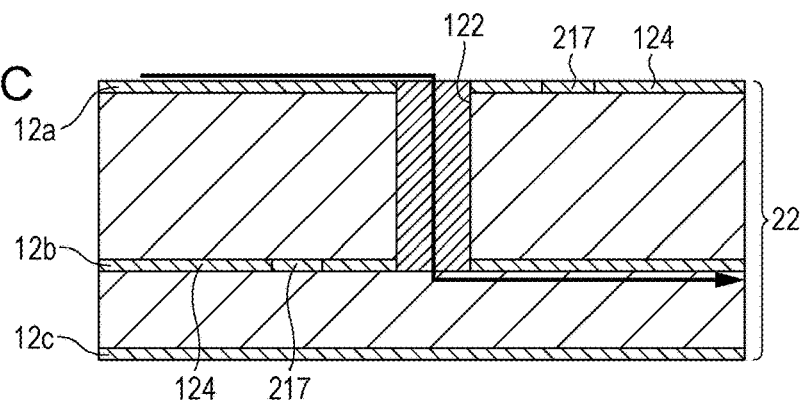
FIG. 19C illustrates an example of the location of the coupling part in the embodiment of the present disclosure.
Figure 19D:
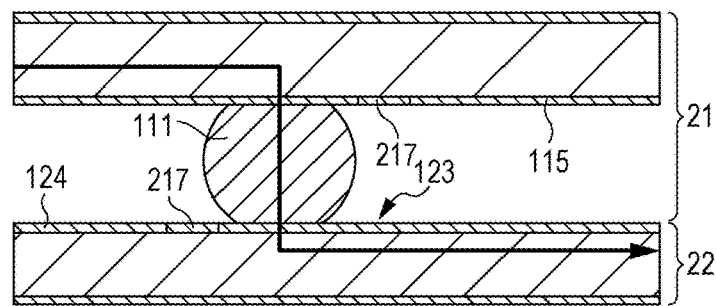
FIG. 19D illustrates an example of the location of the coupling part in the embodiment of the present disclosure.

FIGS. 19A to 19D illustrate examples of locations of the coupling part 217 in this embodiment of the present disclosure. FIG. 19A illustrates a case where the coupling part 217 is disposed in the land 123 connected to the via 122 in the front layer 12a of the printed circuit board 22. FIG. 19B illustrates a case where the coupling part 217 is disposed in the land 123 connected to the via 122 in the inner layer 12b of the printed circuit board 22. FIG. 19C illustrates a case where the coupling parts 217 are disposed in the land 123 connected to the via 122 in the front layer 12a of the printed circuit board 22 and in the land 123 connected to the via 122 in the inner layer 12b. FIG. 19D illustrates a case where the coupling parts 217 are disposed in both of the land 214 connected to the signal transmission ball 111 in the BGA package 21 and the land 123 connected to the signal transmission ball 111 in the front layer 12a of the printed circuit board 22.

In the configurations illustrated in FIGS. 19A to 19D, the land can be partially short-circuited when connected to the ground conductor through the coupling part(s). Thus, excellent pass characteristics of a signal can be maintained, and impedance matching can be obtained.

The radio-frequency module according to the present disclosure is preferable for use as a module connected to an RF chip for a millimeter wave band.

What is claimed is:

1. A radio-frequency module comprising:
   a board;
   an interconnect part having electrical conductivity provided on the board;
   a land having electrical conductivity connected to the interconnect part;
   a transmission circuitry connected to the land to transmit a signal;
   a ground conductor formed at plane completely disposed surrounding a whole circumference of the land and the interconnect part;
   an isolation part disposed between the land and the ground conductor to isolate the land and the ground conductor from each other, and disposed between the interconnect part and the ground conductor to isolate the interconnect part and the ground conductor from each other; and
   a coupling part connected between the land and the ground conductor to short-circuit the land and the ground conductor.

2. The radio-frequency module according to claim 1, wherein
   the coupling part is disposed on a line extending from a line connecting a center of the land and the interconnect part.

3. The radio-frequency module according to claim 1, wherein
   an angle formed by a line connecting a center of the land to the corresponding interconnect part and a line connecting a center of the land to the coupling part is set depending on a frequency band of the signal.

4. The radio-frequency module according to claim 1, wherein
   the isolation part extends radially outward from a center of the land along the coupling part.

5. The radio-frequency module according to claim 1, wherein
   the coupling part comprises a plurality of coupling parts that are disposed at a plurality of locations in the isolation part and short-circuit the land and the ground conductor.

6. A radio-frequency module comprising:
   a multi-layer board including a plurality of layers;
   an interconnect part having electrical conductivity provided on at least one of the plurality of layers of the multi-layer board;
   a land having electrical conductivity connected to the interconnect part;
   a transmission circuitry connected to the land to transmit a signal;
   a ground conductor formed at plane completely disposed surrounding a whole circumference of the land and the interconnect part;
   an isolation part disposed between the land and the ground conductor to isolate the land and the ground conductor from each other, and disposed between the interconnect part and the ground conductor to isolate the interconnect part and the ground conductor from each other; and
   a coupling part connected between the land and the ground conductor to short-circuit the land and the ground conductor.

* * * * *